(12) United States Patent
Twitchen et al.

(10) Patent No.: US 9,977,149 B2
(45) Date of Patent: May 22, 2018

(54) SYNTHETIC DIAMOND OPTICAL ELEMENTS

(71) Applicants: Element Six N.V., Cuijk (NL); Element Six Technologies Limited, Oxfordshire (GB)

(72) Inventors: Daniel Twitchen, Santa Clara, CA (US); Andrew Michael Bennett, Oxfordshire (GB); Yevgeny Vasilievich Anoikin, Santa Clara, CA (US); Hendrikus Gerardus Maria DeWit, Cuijk (NL)

(73) Assignee: Element Six Technologies Limited (GB)

( * ) Notice: Subject to any disclaimer, the term of this patent is extended or adjusted under 35 U.S.C. 154(b) by 265 days.

(21) Appl. No.: 14/770,574

(22) PCT Filed: Mar. 4, 2014

(86) PCT No.: PCT/EP2014/054186
§ 371 (c)(1),
(2) Date: Aug. 26, 2015

(87) PCT Pub. No.: WO2014/135547
PCT Pub. Date: Sep. 12, 2014

(65) Prior Publication Data
US 2016/0025897 A1 Jan. 28, 2016

Related U.S. Application Data

(60) Provisional application No. 61/773,658, filed on Mar. 6, 2013.

(30) Foreign Application Priority Data

Apr. 23, 2013 (GB) .................................. 1307312.7

(51) Int. Cl.
*G02B 1/02* (2006.01)
*G02B 5/18* (2006.01)
(Continued)

(52) U.S. Cl.
CPC ................ *G02B 1/02* (2013.01); *C30B 25/02* (2013.01); *C30B 29/04* (2013.01); *G02B 3/04* (2013.01); *G02B 3/08* (2013.01); *G02B 5/1876* (2013.01)

(58) Field of Classification Search
CPC ........... C30B 25/02; C30B 29/04; G02B 1/02; G02B 3/04; G02B 3/08; G02B 5/1876
(Continued)

(56) References Cited

U.S. PATENT DOCUMENTS

2010/0116197 A1* 5/2010 Godfried ................. C30B 25/02
117/89
2010/0275998 A1* 11/2010 Chang ..................... F24J 2/085
136/259

(Continued)

FOREIGN PATENT DOCUMENTS

EP    0718642 A    6/1996
EP    0718642 A1   6/1996
(Continued)

OTHER PUBLICATIONS

Search Report for GB1307312.7 dated Aug. 30, 2013.
(Continued)

*Primary Examiner* — William R Alexander
*Assistant Examiner* — Grant Gagnon
(74) *Attorney, Agent, or Firm* — Bryan Cave Leighton Paisner LLP

(57) ABSTRACT

An optical element comprising: synthetic diamond material; and a flattened lens surface structure in the form of a zone plate, Fresnel lens, or a spherical lens formed directly in at
(Continued)

least one surface of the synthetic diamond material, wherein the synthetic diamond material has an absorption coefficient measured at room temperature of ≤0.5 cm$^{-1}$ at a wavelength of 10.6 μm, and wherein the synthetic diamond material has a laser induced damage threshold meeting one or both of the following characteristics: the laser induced damage threshold is at least 30 Jcm$^{-2}$ measured using a pulsed laser at a wavelength of 10.6 μm with a pulse duration of 100 ns and a pulse repetition frequency in a range 1 to 10 Hz; and the laser induced damage threshold is at least 1 MW/cm$^2$ measured using a continuous wave laser at a wavelength of 10.6 μm.

15 Claims, 1 Drawing Sheet

(51) Int. Cl.
```
G02B 3/04       (2006.01)
G02B 3/08       (2006.01)
C30B 29/04      (2006.01)
C30B 25/02      (2006.01)
```
(58) Field of Classification Search
USPC ......................................................... 359/356
See application file for complete search history.

(56) References Cited

U.S. PATENT DOCUMENTS

| | | | |
|---|---|---|---|
| 2010/0309279 A1* | 12/2010 | Tamkin | B41J 2/45 347/225 |
| 2016/0003981 A1* | 1/2016 | Twitchen | G02B 1/02 359/601 |

FOREIGN PATENT DOCUMENTS

| | | | | |
|---|---|---|---|---|
| GB | 2433737 A | * | 7/2007 | ............ C30B 25/02 |
| JP | H08240705 A | | 9/1996 | |
| JP | 11049596 A | | 2/1999 | |
| JP | 2006507204 A | | 3/2006 | |
| JP | 2009086613 A | | 4/2009 | |
| JP | 2009266900 A | | 11/2009 | |
| WO | 2011103630 A1 | | 9/2011 | |
| WO | 2012152661 A1 | | 11/2012 | |
| WO | 2013087797 A1 | | 6/2013 | |

OTHER PUBLICATIONS

Search Report for GB1403812.9 dated Aug. 29, 2014.
International Search Report for PCT/EP2014/054186 dated Jun. 26, 2014.
Hausmann, Birgit et al, "Fabrication of Diamond Nanowire for Quantum Information Processing Applications", Diamond and Related Materials 19, pp. 621-629 (2010).
Burek, Michael et al, "Free-Standing Mechanical and Photonic Nanostructures in Single-Crystal Diamond", Nano Letters, 2012,12, pp. 6084-6089.
Uhlen et al, "New diamond nanofabrication process for hard x-ray zone plates", Journal of Vacuum Science Technology B (Microelectronics and Nanometer Structures), vol. 29, No. 6, Oct. 27, 2011, pp. 06FG03-1-06FG03-4.
Hutley, M. C. et al.,"Blazed Zone Plates for the Infrared", Proc. SPIE, vol. 0916, Infrared Systems—Design and Testing, p. 40, 1988.
Gonzales et el.,"Infrared antennas coupled to lithographic Fresnel zone plate lenses", Applied Optics, vol. 43, No. 33, 2004, p. 1.
Kopitkovas, G. et al., "Surface micromachining of UV transparent materials", Thin Solid Films, 453-454 (2004) pp. 31-35.
Gil, D. et al., "The case for diffractive optics in maskless lithography", J. Vac. Sci. Technol. B 21(6) 2003, p. 2810.
Wu, S. et al., "Hard x-ray Zone Plates: Recent Progress", Materials 2012, 5, pp. 1752-1773.
David, C. et al., "Nanofocusing of hard X-ray free electron laser pulses using diamond based Fresnel zone Plates", Scientific Reports, vol. 1:57, 2011, p. 1.
Babinec, T. M. et al., "A diamond nanowire single-photon source", Nature Nanotechnology, 5, pp. 195-199 (2010).
Wojcik, M. et al., "Nanofabrication of x-ray zone plates using ultrananocrystalline diamond molds and electroforming", J. Vac. Sci. Technol. B 28, (2010), p. 30.

* cited by examiner

SYNTHETIC DIAMOND OPTICAL ELEMENTS

FIELD OF INVENTION

The present invention relates to synthetic diamond optical elements and particularly to synthetic diamond optical elements comprising a flattened lens structure in the form of a zone plate, Fresnel lens, or aspherical lens formed directly in a surface of synthetic diamond material. Particular embodiments relate to synthetic diamond optical elements having optical, thermal, and mechanical characteristics suitable for high power optical applications although synthetic diamond optical elements as described herein may also be used in lower power optical applications due to factors including material costs and optical performance.

BACKGROUND OF INVENTION

Flattened lens structures in the form of a zone plate, Fresnel lens, or an aspherical lens are well established for a variety of optical applications and have been fabricated using a variety of materials. Such flattened lens structures can be made thinner than a comparable conventional lens allowing the construction of lenses of large aperture and short focal length without the mass and volume of material that would be required by a conventional lens design.

A Fresnel lens structure effectively divides the continuous surface of a standard lens into a set of surfaces of the same curvature with stepwise discontinuities therebetween. This allows the conventional lens structure to be made much flatter while otherwise functioning to focus light via refraction in a similar manner to a standard lens.

A zone plate is a related "flattened lens" type structure which uses diffraction rather than refraction to focus light and is generally in the form a series of concentric circular zones with alternating absorbing and transmitting zones. The focusing effect is created by constructive interference of waves passing through the transmitting zones.

An aspheric lens is a lens having a surface profile which is not a portion of a sphere or cylinder. An aspherical lens has a surface profile that can reduce or eliminate spherical aberration and also reduce other optical aberrations compared to a conventional lens. Furthermore, aspheric lenses allow a thinner, flatter lens to be made without compromising optical performance.

The material and geometry selected for such flattened lens structures will be dependent on the desired operating wavelength, focal length and thus the end application. In particular, a flattened lens structure will require a substrate material which is transparent at the operating wavelength and the zone structure of the flattened lens will have a geometry optimized to focus the light in the desired manner at the operating wavelength.

Traditionally, visible wavelength flattened lens structures have been fabricated in glass and plastic materials and have applications which vary from very large lens structures to very small lens structures including in lighthouses, book reading aids, projectors, and in camera optics and micro-optics.

For longer wavelength applications in the infrared region suitable infrared transparent substrate materials include $CaF_2$, Si, Ge, ZnSe, and MgO. For example, M. C. Hutley et al. ["Blazed Zone Plates For The Infrared", Proc. SPIE 0916, Infrared Systems—Design and Testing, 40, 1988] have reported a zone plate for focusing infrared radiation which is fabricated in germanium by ion etching, into the surface, a circular fringe pattern recorded in photoresist. An efficiency of 64% at 10.6 μm was measured. F. Gonzalez at el., ["Infrared antennas coupled to lithographic Fresnel zone plate lenses", Applied Optics, vol. 43, no. 33, 2004] have also reported a zone plate for focusing infrared radiation based on a silicon substrate.

For longer wavelength applications UV transparent materials including quartz, $CaF_2$, $BaF_2$, and sapphire are widely used in optics. For example, Fresnel lenses in quartz are applied as beam homogenizers for a high power excimer and Nd:YAG lasers. Quartz is a suitable optical material at wavelengths ≥248 nm but for shorter wavelengths absorption of quartz strongly increases. Accordingly, $CaF_2$, $BaF_2$, and sapphire are more favourable optical materials in the UV region below 248 nm. G. Kopitkovas et al. ["Surface micromachining of UV transparent materials", Thin Solid Films, 453-454 (2004) 31-35] have reported a surface micromachining method for such UV transparent materials which utilizes an XeCl excimer laser and an absorbing liquid in contact with the material for precise structuring of UV optical structures. In addition, D. Gil et al. [J. Vac. Sci. Technol. B 21(6) 2003] have reported the use of hydrogen silsesquioxane (HSQ) on a fused silica substrate with an absorber material such as chrome for fabricating diffractive optical elements that operate in the UV and deep UV regions.

For x-ray applications traditionally zones plates fabricated from high atomic number metals such as Ta, Au, Ir, and W have been used but it has been reported that the high heat load generated in the 2 to 12 keV photon energy range can deteriorate such materials. Wu et al. [Hard x-ray Zone Plates: Recent Progress, Materials 2012, 5, 1752-1773] have reported that the technology to focus hard x-rays (photon energy larger than 1-2 keV) made great progress in the period from 2009 to 2012 with the progress being particularly spectacular for lenses based on the Fresnel zone plate concept. It is reported that during this three year period the spatial resolution of such x-ray zone plates increased by a factor of three, opening up entirely new domains of application, specifically in biomedical research. It is also reported that diamond based zone plates have been developed which are stable at very high laser intensities citing work by Uhlén et al., David et al., and Wojcik et al. which is discussed in more detail below.

Uhlén et al. ["New diamond nanofabrication process for hard x-ray zone plates", J. Vac. Sci. Technol. B 29, 06FG03 (2011)] have indicated that diamond is the optimal zone plate material for x-ray applications due to its high thermal conductivity and low absorption of hard x-rays. A number of masking and etching techniques are discussed for fabricating diffraction grating structures in diamond material. It is indicated that nanostructuring of diamond is primarily achieved via oxygen plasma based etching and that different combinations of hard masks and oxygen recipes have been used. Examples of hardmasks are disclosed as including HSQ, Ni—Ti, and Al. The authors report on a new tungsten-hardmask-based diamond dry-etch process for fabricating diamond zone plate lenses with a high aspect ratio. The tungsten hardmask was structured by electron-beam lithography, together with $Cl_2/O_2$ and $SF_6/O_2$ reactive ion etching in a trilayer resist-chromium-tungsten stack. The underlying diamond (dimensions 5 mm×5 mm×100 μm sourced from Diamond Materials GmbH) was then etched in an $O_2$ plasma using the following parameters: 10 sccm $O_2$ gas flow, 3 mTorr pressure, 100 W rf power, 200 W ICP, and 20° C. sample temperature. The authors report diamond gratings with half-pitch down to 80 nm and a height of 2.6 μm, as well as zone plates with a 75 μm diameter and 100 nm outermost zone width. The diffraction efficiency of the zone plates was measured to 14.5% at an 8 keV x-ray energy, and the imaging properties were investigated in a scanning microscope arrangement showing sub-100-nm resolution. Uhlén et al. suggest that the imaging and thermal properties of these lenses make them suitable for use with high-brightness x-ray free-electron laser sources. C. David et al. [Scientific Reports, Vol 1, Article no. 57, 2011] also disclose the fabrication of a diamond based Fresnel zone plate suitable for focussing of hard x-ray free electron laser pulses. Three types of zone plate were fabricated and tested by David et al. as discussed below.

The first type of zone plate fabricated by David et al. was a metal based zone plate rather than a diamond based zone plate and consisted of gold nanostructures. David et al. report that several lenses were irradiated with x-rays and it was found that the zone plates degraded rapidly and were completely destroyed within 3 minutes. The x-ray dose transferred to the gold structures per pulse was approximately 0.1 eV/atom which is below the dose required to initiate melting (0.4 eV/atom). However, due to poor heat dissipation, the temperature of the zone structures rose rapidly, triggering recrystallisation of the gold.

In order to improve the radiation hardness, a second type of zone plate was fabricated by David et al. based on diamond material. David et al. suggest that the excellent thermal conductivity, low x-ray absorption, and high melting point of diamond material render it ideally suited for this application. The diamond based zone plates were fabricated on polished 4-5 μm thick diamond membranes (Diamond Materials GmbH) supported by Si frames. The membranes were vapour-coated with a 5-nm thick Cr adhesive and conductive layer and then spin-coated with a 400-550 nm thick layer of negative-tone hydrogen silsesquioxane (HSQ) resist (FOx-16 solution, Dow Corning Corp). A zone plate pattern was formed in the HSQ via electron beam lithography and the Cr layer was removed by dry etching in a $Cl_2/CO_2$ plasma to expose the underlying diamond surface. The diamond layers were then etched in an inductively coupled plasma reactive ion etcher. It is reported that the parameters of the diamond etch which was used are similar to those described by Babinec, T. M. et al. ["A diamond nanowire single-photon source", Nature Nanotechnology, 5, 195-199 (2010)].

Unlike the previously described gold based zone plates, the diamond zone plates were not damaged by x-ray exposure. However, David et al. indicate that at hard photon energies, the main draw-back of diamond is its low refractive index decrement at high photon energies, leading to very low diffraction efficiencies. In order to enhance the number of photons diffracted into the focal spot, a third type of zone plate was fabricated in which the diamond zone structures were filled with iridium by atomic layer deposition (ALD). This approach offers the strong phase-shifting property of this very dense, refractory material (density: 22.5 g/cm3, melting point: 2739 K) in intimate contact with a structure of interdigitated diamond cooling fins for optimised heat dissipation. David et al. report that while a pure diamond device was capable of diffracting only 2.1% of the incoming 8 keV radiation into focus, an Ir-filled diamond zone plate reached 13.2% efficiency at the same photon energy. Furthermore, it is reported that the diamond based device did not show any noticeable change in structural integrity or optical performance when applying the same pulse energy and pulse rate that destroyed the gold zone plates.

In contrast to David et al. who fabricated an Ir-filled diamond zone plate as described above, Wojcik et al. [J. Vac. Sci. Technol. B 28, C6P30 (2010)] have fabricated x-ray zone plates by depositing gold via electroplating onto an ultrananocrystalline diamond mold.

While the aforementioned documents have suggested the use of diamond material for x-ray zone plates, the zone plate structures are not suitable for applications at longer wavelengths in the infrared, visible, and ultraviolet regions of the electromagnetic spectrum. Furthermore, the present inventors have identified a number of potential problems with merely changing the geometry of the described structures to operate at longer wavelengths, particularly for high power optical applications in the infrared, visible, and ultraviolet regions. This is because while diamond materials are relatively transparent at x-ray wavelengths, only high quality optical grades of diamond material (e.g. as available from Element Six Ltd) have the desired transparency across the infrared, visible, and ultraviolet regions of the electromagnetic spectrum. Furthermore, even if high quality optical grades of diamond material are patterned to have an optical surface structure, achieving the desired optical performance whilst also providing a robust optical element with a high laser induced damage threshold in the infrared, visible, and ultraviolet regions of the electromagnetic spectrum is problematic. The optical performance of such surface finishes has been variable due to the difficulty in processing precisely defined surface patterns into diamond material because of the extreme hardness and low toughness of diamond materials. Furthermore, the processing methods required to form optical surface structures in diamond materials have resulted in significant surface and sub-surface crystal damage being incorporated into the diamond material. This surface and sub-surface damage in a synthetic diamond optical element causes a number of inter-related detrimental effects including: (1) a reduction in the laser induced damage threshold of the synthetic diamond optical element; (2) a reduction in the power at which the synthetic diamond optical element can operate; and (3) a reduction in the optical performance of the synthetic diamond optical element as a result of beam aberrations caused by the surface and sub-surface damage. As such it would be desirable to develop a process which forms precisely defined flattened lens structures in high quality optical grade synthetic diamond material without introducing surface and sub-surface crystal damage so as to achieve a synthetic diamond optical element which has a high laser induced damage threshold and high optical performance with minimal beam aberrations on transmission through the synthetic diamond optical element. Such synthetic diamond optical elements may be used at wavelengths in the infrared, visible, and ultraviolet regions of the electromagnetic spectrum for lens applications where optical performance and robustness to high laser powers is highly sensitive to the bulk crystal quality of the diamond material, the quality of the patterned optical surface finish, and the presence of any surface or sub-surface crystal damage caused during fabrication of the optical surface finish.

In light of the above, it is an aim of embodiments of the present invention to provide a synthetic diamond optical element comprising a flattened lens surface structure in the form of a zone plate, Fresnel lens, or aspherical lens formed directly in at least one surface of the synthetic diamond material and which is formed of a high optical quality synthetic diamond material while also having low surface and sub-surface crystal damage thus exhibiting a high laser induced damage threshold in the infrared, visible, and/or ultraviolet regions of the electromagnetic spectrum. It is a further aim to develop a technique for fabricating such flattened lens surface structures in synthetic diamond material which is relatively quick and low cost.

SUMMARY OF INVENTION

According to a first aspect of the present invention there is provided an optical element comprising:
synthetic diamond material; and
a flattened lens surface structure in the form of a zone plate, Fresnel lens, or aspherical lens formed directly in at least one surface of the synthetic diamond material,
wherein the synthetic diamond material has an absorption coefficient measured at room temperature of $\leq 0.5$ cm$^{-1}$ at a wavelength of 10.6 µm, and
wherein the synthetic diamond material has a laser induced damage threshold meeting one or both of the following characteristics:
the laser induced damage threshold is at least 30 Jcm$^{-2}$ measured using a pulsed laser at a wavelength of 10.6 µm with a pulse duration of 100 ns and a pulse repetition frequency in a range 1 to 10 Hz; and
the laser induced damage threshold is at least 1 MW/cm$^2$ measured using a continuous wave laser at a wavelength of 10.6 µm.

According to a second aspect of the present invention there is provided an optical system comprising:
an optical element as defined above; and
a light source configured to generate light at a power of at least 20 kW and transmit said light through the optical element at an operating wavelength in the infrared, visible, or ultraviolet region of the electromagnetic spectrum.

BRIEF DESCRIPTION OF THE DRAWINGS

For a better understanding of the present invention and to show how the same may be carried into effect, embodiments of the present invention will now be described by way of example only with reference to the accompanying drawings, in which.

DETAILED DESCRIPTION

Figure 1:
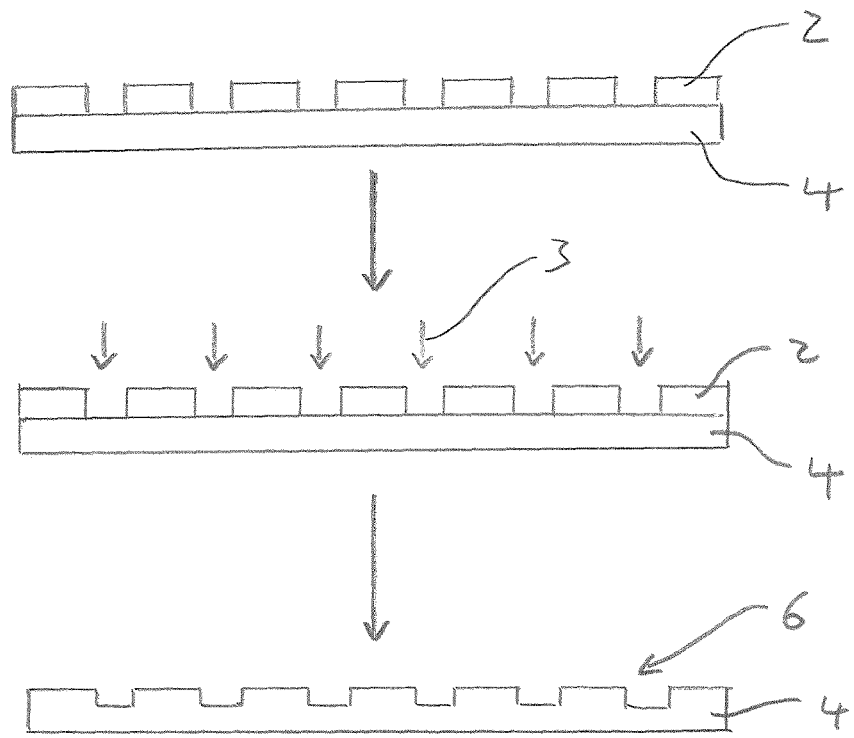
FIG. 1 shows a schematic flow diagram of a method of fabricating an optical element comprising synthetic diamond material with a flattened lens surface structure formed directly in a surface of the synthetic diamond material.

The present inventors have realized that recent developments in processing of high purity single crystal CVD diamond materials in the field of quantum sensing and quantum information processing can be can be transferred to the field of high power laser optics to solve the problems outlined in the background section of this specification and achieve the fabrication of synthetic diamond optical elements comprising a flattened lens surface structure in the form of a zone plate, Fresnel lens, or aspherical lens formed directly in at least one surface of the synthetic diamond material and which is formed of a high optical quality synthetic diamond material, such as optical grade polycrystalline CVD diamond, while also having low surface and sub-surface crystal damage thus exhibiting a high laser induced damage threshold in the infrared, visible, and/or ultraviolet regions of the electromagnetic spectrum.

Research into the use of high purity single crystal CVD diamond materials in the field of quantum sensing and quantum information processing is focussed on a particularly kind of point defect found within the diamond crystal lattice, namely the negatively changed nitrogen-vacancy defect (NV$^-$). The NV$^-$ defect has an electronic spin which can be manipulated to function as a quantum bit or alternatively as a quantum sensing element. The NV$^-$ defect can be optically excited, manipulated using microwaves, and emits fluorescent light which is characteristic of its electronic spin state.

One requirement for quantum sensing and quantum information processing applications is that the NV$^-$ electronic spin defect should have a long quantum coherence time and this requires the NV$^-$ electronic spin defect to be located in a highly pure diamond lattice environment which has a low concentration of crystal defects and low internal stress which can otherwise detrimentally reduce the quantum coherence time of the NV$^-$ electronic spin defects disposed within the diamond crystal lattice. Another requirement for quantum sensing and quantum information processing applications is that the fluorescent light emitted from the NV$^-$ electronic spin defects needs to be efficiently out-coupled from the diamond material to a suitable processor or detector configuration and in this regard it is desirable to fabricate nanowires, optical waveguide structures, and photonic cavity structures into the diamond material in order to effectively out-couple photons emitted from the NV$^-$ electronic spin defects. Inductively coupled plasma etching (similar to that used by Uppsala University and discussed previously in the background section of this specification) has been used to fabricate such optical structures. However, it has been found that fabrication processes tend to introduce surface and sub-surface damage into the diamond crystal structure which adversely effects the quantum coherence time of the near-surface NV$^-$ electronic spin defects coupled to the optical surface structures. Furthermore, it has been found that the quality of the desired surface structures and the formation of unwanted etch grass between the desired surface structures is sensitive to the type of etch mask used and to the etch conditions. As such, recent work by groups developing structures for diamond quantum devices has focussed on refining the inductively coupled plasma (ICP) etching process in order to allow fabrication of optical out-coupling structures for near-surface NV$^-$ electronic spin defects without introducing significant quantities of surface and sub-surface damage into the diamond crystal structure while at the same time achieving well defined optical structures in the diamond surface without unwanted etch grass disposed between the structures. This work is described in a number of publications including: B. Hausmann et al, Fabrication of diamond nanowires for quantum information processing applications, Diamond and Related Materials 19, 621-629 (2010); M. Burek et al., Free-standing mechanical and photonic nanostructures in single crystal diamond, Nano Lett. 2012; and US2001/0309265.

Groups developing structures for diamond quantum devices have experimented with a variety of different combinations of gas flow rates, ICP powers, and pressures for fabricating optical out-coupling structures in single crystal CVD diamond material without introducing significant quantities of surface and sub-surface crystal damage into the single crystal CVD diamond structure. For example, the following inductively coupled plasma reactive ion etching (ICP RIE) recipe is reported in the literature as being suitable for this purpose: an oxygen etchant which has an oxygen gas flow of between 30 to 50 sccm $O_2$, a chamber pressure of approximately 10 mTorr, and an ICP power of approximately 700 W. It is reported that this etch recipe allows the formation of very well defined surface structures while avoiding the formation of etch grass between the desired surface structures. In addition, it is reported that the shape and quantity of the etched optical structures in a diamond surface can be controlled by varying the ICP power during the etching process. For example, in the fabrication of nano-wires in the surface of single crystal CVD diamond material a multi-step ICP RIE process is reported including applying an ICP power of 700 W for two minutes, an ICP power of 600 W for three minutes, and an ICP power of 1000 W for five minutes. Further still, a number of different etch masks are reported in the diamond quantum device literature including $Al_2O_3$ particles, Au particles, $SiO_2$ particles, evaporated Au, and FOx e-beam resist.

In light of the above, it is evident that groups developing structures in high purity single crystal CVD diamond material for diamond quantum devices based on defects in the diamond lattice have successfully developed an ICP RIE process which is capable of forming well defined surface structures in diamond material without forming unwanted etch grass between such structures and without introducing a large amount of surface and sub-surface crystal damage. This technology has been developed specifically for efficiently out-coupling fluorescent light emitted from $NV^-$ electronic spin defects in quantum sensing and quantum information processing applications including the formation of nanowires, optical waveguide structures, and photonic cavity structures into the diamond material in order to effectively out-couple photons emitted from the $NV^-$ electronic spin defects.

The present inventors have realized that the requirements for out-coupling structures such as nanowires, optical waveguide structures, and photonic cavity structures in quantum sensing and quantum information processing applications are very similar to the requirements for the fabrication of better flattened lens surface structures such as zone plates, Fresnel lenses, and aspherical lenses in transmissive diamond optical elements suitable for high power laser applications in the infrared, visible, and ultraviolet regions of the electromagnetic spectrum. That is, the etching technology developed for quantum sensing and quantum information processing applications can be applied to transmissive optical elements fabricated using optical grade synthetic diamond material, such as optical grade polycrystalline CVD diamond, to form precisely defined flattened lens surface structures directly in the surface of the synthetic diamond material without causing substantial surface and sub-surface crystal damage such that the optical element will exhibit low optical absorbance in combination with a high laser induced damage threshold and good optical focussing with low beam aberration. While the etching technology developed for quantum sensing and quantum information processing applications is utilized for etching nanowires, optical waveguide structures, and photonic cavity structures in single crystal CVD diamond material comprising fluorescent $NV^-$ defects, in accordance with embodiments of the present invention the etching technology is applied to low absorbance optical quality diamond material, such as high quality polycrystalline CVD diamond material, to fabricate low surface damage flattened lens surface structures therein and thus produce optical elements having a combination of low optical absorbance in combination with a high laser induced damage threshold and good optical focussing with low beam aberration.

A method of fabricating an optical element is provided as illustrated in FIG. 1 which comprises:

forming a patterned resist layer 2 on at least one surface of a synthetic diamond material 4;

etching 3 the at least one surface of the synthetic diamond material 4 through the patterned resist layer 2; and removing the patterned resist layer to leave a flattened lens surface structure 6 formed directly in the at least one surface of the synthetic diamond material 4, wherein the etching comprises, for example, an inductively coupled plasma reactive ion etching (ICP RIE) process comprising an oxygen gas flow rate of between 20 to 50 sccm $O_2$, a chamber pressure of between 5 and 20 mTorr, and an ICP power of between 600 and 1100 W.

Optionally, the inductively coupled plasma reactive ion etching process comprises one or more of: an oxygen flow rate between 25 and 35 sccm $O_2$; a chamber pressure between 7 and 15 mTorr; and an ICP power between 700 and 1000 W. The inductively coupled plasma reactive ion etching process may also comprise multiple steps with different ICP powers to control the surface profile of the flattened lens surface structure. Furthermore, the patterned resist layer may be formed from one of: $Al_2O_3$ particles; Au particles; $SiO_2$ particles; evaporated Au; and FOx e-beam resist. In practice, the resist is selected to be tolerant to a controlled deep etch. For example, a resist may be selected to be compatible with the formation of surface etch features having a height equal to or greater than 2 µm, 4 µm, 6 µm, 8 µm, or 10 µm.

In addition to the above, it has been noted that certain prior art approaches as described in the background section utilize a direct-write electron-beam lithography process for patterning of the resist prior to etching. This direct-write electron-beam lithography process can be somewhat time consuming and expensive. As such, according to one alternative option which may provide a faster and more cost effective route to patterning the resist layer, it is proposed that the patterned resist layer is formed using an interference lithography technique. Interference lithography techniques are already known in the art for forming moth eye antireflective structures in other materials. For example, Telaztec™ utilize this approach for fabricating moth eye antireflective structures in a range of materials. It is proposed here that such an interference lithography technique for patterning the resist may be combined with a low surface/sub-surface crystal damage etching technology as a route to providing a commercially viable way of fabricating transmissive diamond optical elements comprising flattened lens structures for high power laser applications.

Applying the aforementioned methodology, one aspect of the present invention is an optical element comprising:

synthetic diamond material; and a flattened lens surface structure in the form of a zone plate, Fresnel lens, or aspherical lens formed directly in at least one surface of the synthetic diamond material, wherein the synthetic diamond material has an absorption coefficient measured at room temperature of $\leq 0.5$ cm$^{-1}$, $\leq 0.4$ cm$^{-1}$, $\leq 0.3$ cm$^{-1}$, $\leq 0.2$ cm$^{-1}$, $\leq 0.1$ cm$^{-1}$, $\leq 0.07$ cm$^{-1}$ or $\leq 0.05$ cm$^{-1}$ at a wavelength of 10.6 µm, and wherein the synthetic diamond material has a laser induced damage threshold meeting one or both of the following characteristics:

the laser induced damage threshold is at least 30 Jcm$^{-2}$, 50 Jcm$^{-2}$, 75 Jcm$^{-2}$, 100 Jcm$^{-2}$, 150 Jcm$^{-2}$, or 200 Jcm$^{-2}$ measured using a pulsed laser at a wavelength of 10.6 μm with a pulse duration of 100 ns and a pulse repetition frequency in a range 1 to 10 Hz; and the laser induced damage threshold is at least 1 MW/cm², 5 MW/cm², 10 MW/cm², 20 MW/cm², or 50 MW/cm² measured using a continuous wave laser at a wavelength of 10.6 μm.

Absorbance and laser induced damage threshold of an optical element are readily measurable by those skilled in the art (for example, ISO 21254-2:2011 describes methods for measuring laser induced damage threshold while Sussmann et al. [Diamond and Related Materials, 3, 1173-117, 1994] describe the specific application of laser damage testing to CVD diamond windows).

The flattened lens surface structure can be configured to focus light at an operating wavelength in the infrared, visible, or ultraviolet region of the electromagnetic spectrum. It is known in the art how to optimize the design of a zone plate, Fresnel lens, or aspherical lens surface structure for a particular operating wavelength. What is considered to be new here is the ability to provide of a zone plate, Fresnel lens, or aspherical lens surface structure in synthetic diamond material which has low optical absorbance, low surface and sub-surface crystal damage, and a high laser induced damage threshold in the infrared, visible, or ultraviolet region of the electromagnetic spectrum. For example, the optical element may be configured to focus light at an operating wavelength selected from one of: 10.6 μm; 1.06 μm; 532 nm; 355 nm; or 266 nm, with an operating wavelength of 10.6 μm being preferred for certain commercial applications. The optical element preferably has a reflectance of no more than 3%, 2%, 1.5%, 1%, or 0.5% at the operating wavelength of the optical element. Furthermore, the optical element preferably has a transmittance of at least 97%, 98% or 99% at the operating wavelength of the optical element.

A synthetic diamond optical element is provided which provides low absorbance and high quality optical performance in combination with a high laser induced damage threshold. This is considered to be a key combination of parameters for high power laser optics. As such, the present invention is considered to be an enabling technology for high power laser systems. Furthermore, by applying the methodology as described herein a synthetic diamond optical element can be configured to have a flattened lens structure with a low beam aberration and low optical scatter. For example, the optical element preferably has a total integrated scatter in a forward hemisphere no more than 2%, 1%, 0.5%, or 0.1% at the operating wavelength of the optical element.

Zone plates, Fresnel lenses, and aspherical lenses effectively provide flattened lens structures which do not require such a thick piece of diamond material as a standard lens structure while providing an equivalent or better lensing effect. Zone plates may be preferable for certain applications as they don't require curved surfaces whereas Fresnel lenses and aspherical lenses do comprise curved surfaces which are more difficult to process into diamond material. That said, the diamond etching technologies developed in the quantum device field for single crystal CVD diamond material comprising NV⁻ defects have been shown to be very controllable and thus curved surfaces suitable for Fresnel lenses and aspherical lenses are achievable using these etching technologies.

Optionally, the synthetic diamond material may also have one or more of the following characteristics:

a dielectric loss coefficient tan δ measured at room temperature at 145 GHz of $\leq 2\times 10^{-4}$, $\leq 10^{-4}$, $\leq 5\times 10^{-5}$, $\leq 10^{-5}$, $\leq 5\times 10^{-6}$, or $\leq 10^{-6}$;

an average black spot density no greater than 5 mm⁻², 3 mm⁻², 1 mm⁻², 0.5 mm⁻², or 0.1 mm⁻²;

a black spot distribution such that there are no more than 5, 4, 3, 2, or 1 black spots within any 3 mm² area;

an integrated absorbance per unit thickness of no more than 0.20 cm⁻², 0.15 cm⁻², 0.10 cm⁻², or 0.05 cm⁻², when measured with a corrected linear background in a range 2760 cm⁻¹ to 3030 cm⁻¹;

a thermal conductivity of no less than 1800 Wm⁻¹K⁻¹, 1900 Wm⁻¹K⁻¹, 2000 Wm⁻¹K⁻¹, 2100 Wm⁻¹K⁻¹, or 2200 Wm⁻¹K⁻¹;

a silicon concentration as measured by secondary ion mass spectrometry of no more than $10^{17}$ cm⁻³, $5\times 10^{16}$ cm⁻³, $10^{16}$ cm⁻³, $5\times 10^{15}$ cm⁻³, or $10^{15}$ cm⁻³; and an oxygen terminated surface.

Such optical characteristics can be achieved by applying the patterning technology as described herein to high quality optical grades of synthetic diamond material such as high quality optical grade polycrystalline CVD diamond available from Element Six Limited. It is also envisaged that the patterning technology may be applied to optical grade single crystal CVD diamond (also available from Element Six Limited) for certain applications. Advantageously, the optical element meets one or more of the optical characteristics as described herein over at least 50%, 60%, 70%, 80%, 90%, or 100% of the area of the surface of the synthetic diamond optical element in which the flattened lens surface structure is formed. In this regard, diamond optical elements can be fabricated to relatively large areas. For example, synthetic diamond components can be fabricated to a have largest linear dimension of at least 10 mm, 20 mm, 40 mm, 60 mm, 80 mm, 100 mm, 120 mm, or 140 mm.

Such synthetic diamond components may be fabricated with a thickness equal to or greater than 200 μm, 250 μm, 350 μm, 450 μm, or 500 μm and/or a thickness equal to or less than 1000 μm, 750 μm, 650 μm, 550 μm, or 450 μm and/or a thickness lying in a range defined by any combination of these lower and upper limits.

Advantageously, the synthetic diamond material is fabricated by growing to a target thickness greater than that required for the final optical element and then processing a nucleation face of the diamond material to remove early stage nucleation diamond. If early stage nucleation diamond is incorporated into the final optical element this can lead to a reduction in thermal conductance and an increase in optical absorbance. By growing the synthetic diamond material to a target thickness greater than that required for the final optical element it is possible to remove early stage nucleation diamond and thus provide an optical element with higher thermal conductance and lower optical absorbance. Removal of early stage nucleation diamond will inevitably result in a slight reduction in the strength of the synthetic diamond material. However, manufacturers such as Element Six Limited are capable of fabricating thick wafers of synthetic diamond material, such as polycrystalline CVD diamond wafers, with a high tensile rupture strength which enables removal of early stage nucleation diamond while retaining sufficient mechanical strength for end applications. For example, the synthetic diamond material may have one or more of the following structural characteristics:

a tensile rupture strength with a nucleation face of the synthetic diamond material in tension of: ≥760 MPa×n for a thickness of 200 to 500 μm; ≥700 MPa×n for a thickness of 500 to 750 µm; ≥650 MPa×n for a thickness of 750 to 1000 µm; ≥600 MPa×n for a thickness of 1000 to 1250 µm; ≥550 MPa×n for a thickness of 1250 to 1500 µm; ≥500 MPa×n for a thickness of 1500 to 1750 µm; ≥450 MPa×n for a thickness of 1750 to 2000 µm; or ≥400 MPa×n for a thickness of ≥2000 µm, wherein multiplying factor n is 1.0, 1.1, 1.2, 1.4, 1.6, 1.8, or 2; and a tensile rupture strength with a growth face of the synthetic diamond material in tension of: ≥330 MPa×n for a thickness of 200 to 500 µm; ≥300 MPa×n for a thickness of 500 to 750 µm; ≥275 MPa×n for a thickness of 750 to 1000 µm; ≥250 MPa×n for a thickness of 1000 to 1250 µm; ≥225 MPa×n for a thickness of 1250 to 1500 µm; ≥200 MPa×n for a thickness of 1500 to 1750 µm; ≥175 MPa×n for a thickness of 1750 to 2000 µm; or ≥150 MPa×n for a thickness of ≥2000 µm, wherein multiplying factor n is 1.0 1.1, 1.2, 1.4, 1.6, 1.8, or 2.

Such synthetic diamond material may be processed to a surface flatness ≤5 µm, ≤4 µm, ≤3 µm, ≤2 µm, ≤1 µm, ≤0.5 µm, ≤0.2 µm, ≤ or 0.1 µm and/or a surface roughness $R_a$ no more than 200 nm, 150 nm, 100 nm, 80 nm, 60 nm, 40 nm, 20 nm, or 10 nm.

Further improvements to the thermal conductivity of the synthetic diamond material can be made by reducing the natural 1.1% $^{13}C$ content of the material. As such, the synthetic diamond material may comprise at least a portion which has a $^{13}C$ content of less than 1.0%, 0.8%, 0.6%, 0.4%, 0.2%, 0.1%, 0.05%, or 0.01%. In this regard, it should be noted that isotopically purified carbon source gas is expensive. As such, rather than fabricate the entire optical element from isotopically purified diamond material it can be advantageous to only fabricate a portion of the optical element from isotopically purified diamond material. For example, one or more surface layers of the synthetic diamond material may be formed of isotopically purified diamond material with the interior bulk being fabricated using a higher $^{13}C$ content, preferable natural abundance. In one particularly useful embodiment a surface layer comprising the flattened lens surface structure is formed of isotopically purified diamond material so as to increase the thermal conductivity of the flattened lens surface structure and thus reduce localized heating and increase the laser induced damage threshold of the flattened lens surface structure. An underlying portion of synthetic diamond material may then comprise a higher concentration of $^{13}C$, preferably natural abundance, to reduce synthesis costs.

The flattened lens surface structures of the present invention may be formed over the majority of a surface of the synthetic diamond material, e.g. over at least 50%, 60%, 70%, 80%, 90%, or over the entire surface. As such, the flattened lens surface structures can be formed over an area of at least 50 mm², 100 mm², 200 mm², 300 mm², 500 mm², 700 mm², 1000 mm², 1500 mm², 2000 mm², 3000 mm², 5000 mm², 7000 mm², 10000 mm², 15000 mm², or 20000 mm.

The surface which is patterned with the flattened lens surface structure may, for example, form the major optical exit and/or entry face of a diamond window with a majority, or the entire, optical exit and/or entry face of the optical element being patterned with a flattened lens surface structure. In some applications it may be desirable to leave an unpatterned portion around a peripheral region of the transmissive optical element for mounting the optical element. Optionally, a flattened lens surface structure is formed on at least two surfaces of the synthetic diamond material. For example, the flattened lens surface structure can be formed on one or both of the optical entry face and the optical exit face of the optical element, e.g. on opposing major faces of a diamond window.

Advantageously the synthetic diamond material has an oxygen terminated surface as this is more thermally stable than a hydrogen terminated surface for high power laser applications. For certain applications the flattened lens surface structure is coated with an anti-reflective coating. Alternatively, or additionally, an antireflective surface pattern, such as a moth-eye structure can be formed directly into at least one surface of the synthetic diamond material using the etching technology as described herein. For example, an optical element may be provided with an antireflective surface pattern etched into one face of the optical element and a flattened lens structure etched into an opposing face of the optical element. Alternatively, an antireflective surface structure may be formed over a flattened lens surface structure such that a surface structure is provided which has both good focal quality and low surface reflectance. To further modify the functionality of the synthetic diamond optical element it is also possible to provide a flattened lens surface structure in which zone structures are filled with a solid material which is selected to enhance diffraction and/or refraction efficiency of the flattened lens surface structure.

Optical elements fabricated from high quality optical grade synthetic diamond material and comprising a flattened lens surface structure as described herein are suitable for use in high power optical systems due to their high laser induced damage threshold at an operating wavelength in the infrared, visible, and/or ultraviolet region of the electromagnetic spectrum. As such, according to another aspect of the present invention there is provided an optical system as illustrated in FIG. 2 comprising:

a synthetic diamond optical element 10 comprising a flattened lens surface structure as described herein; and a light source 12 (e.g. a laser) configured to generate light 14 at a power of at least 20 kW, 25 kW, 30 kW, 35 kW, 40 kW, 45 kW, or 50 kW and transmit said light through the synthetic diamond optical element 10 at an operating wavelength in the infrared, visible, or ultraviolet region of the electromagnetic spectrum.

In relation to the above, it will be noted that the operating power of the described optical system is significantly lower that the previously defined continuous wave laser induced damage threshold of 1 MW/cm². However, it should be noted that to provide an optical element that has a long operating lifetime the laser induced damage threshold of the synthetic diamond optical element should be significantly higher than the operating power of the optical system.

Figure 2:
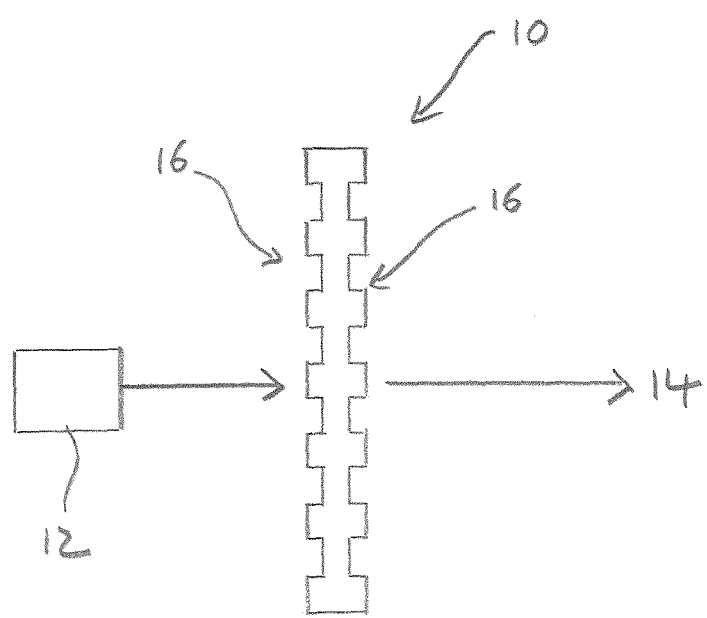
FIG. 2 shows a schematic diagram of a high power laser system comprising a high power laser source and an optical element formed of synthetic diamond material with a flattened lens surface structure formed directly in a surface of the synthetic diamond material.

In the illustrated embodiment of FIG. 2 the optical element 10 is in the form of a transmissive diamond window with a zone plate 16 fabricated in both major faces of the window. It should be noted that while the surface pattern illustrated in FIGS. 1 and 2 has a rectangular form this is for illustrative purposes only. The etching technology as described herein is capable of generating a range of cross-sectional shapes and thus is it possible to tailor the profile of the surface structure in order to optimize optical lensing while maintaining a high laser induced damage threshold for a particular application requirement.

Optionally, the aforementioned optical system may also provide a cooling system for cooling the synthetic diamond optical element. In this regard, the present inventors have noted that Element Six's optical grade synthetic diamond material shows a large decrease in optical absorption at low temperatures. This effect is not seen to the same extent with certain other diamond materials.

In summary, it is believed that optical elements as described herein comprise the key combination of parameters for diamond lenses in high power laser systems. As such, the present invention is considered to be an enabling technology for high power laser systems which require lensing structures. Furthermore, it is also envisaged that optical elements as described herein may be used in lower power optical applications taking advantage of lower material costs and higher optical performance when compared to more conventional diamond lenses.

While this invention has been particularly shown and described with reference to embodiments, it will be understood to those skilled in the art that various changes in form and detail may be made without departing from the scope of the invention as defined by the appendant claims.

The invention claimed is:

1. An optical element comprising:
   synthetic diamond material; and
   a flattened lens surface structure in the form of a zone plate, Fresnel lens, or aspherical lens formed directly in at least one surface of the synthetic diamond material, wherein the synthetic diamond material has an absorption coefficient measured at room temperature of $\leq 0.5$ cm$^{-1}$ at a wavelength of 10.6 µm, and
   wherein the synthetic diamond material has a laser induced damage threshold meeting one or both of the following characteristics:
   the laser induced damage threshold is at least 30 Jcm$^{-2}$ measured using a pulsed laser at a wavelength of 10.6 µm with a pulse duration of 100 ns and a pulse repetition frequency in a range 1 to 10 Hz; and
   the laser induced damage threshold is at least 1 MW/cm$^2$ measured using a continuous wave laser at a wavelength of 10.6 µm.

2. An optical element according to claim 1, wherein the laser induced damage threshold is at least 50 Jcm$^{-2}$, 75 Jcm$^{-2}$, 100 Jcm$^{-2}$, 150 Jcm$^{-2}$, or 200 Jcm$^{-2}$ measured using said pulsed laser.

3. An optical element according to claim 1, wherein the laser induced damage threshold is at least 5 MW/cm$^2$, 10 MW/cm$^2$, 20 MW/cm$^2$, or 50 MW/cm$^2$ measured using said continuous wave laser.

4. An optical element according to claim 1, wherein the synthetic diamond material has an absorption coefficient measured at room temperature of $\leq 0.4$ cm$^{-1}$, $\leq 0.3$ cm$^{-1}$, $\leq 0.2$ cm$^{-1}$, $\leq 0.1$ cm$^{-1}$, $\leq 0.07$ cm$^{-1}$ or $\leq 0.05$ cm$^{-1}$ at 10.6 µm.

5. An optical element according to claim 1, wherein the synthetic diamond material has a dielectric loss coefficient tan δ measured at room temperature at 145 GHz of $\leq 2 \times 10^{-4}$, $\leq 10^{-4}$, $\leq 5 \times 10^{-5}$, $\leq 10^{-5}$, $\leq 5 \times 10^{-6}$, or $\leq 10^{-6}$.

6. An optical element according to claim 1, wherein the synthetic diamond material has one or more of the following characteristics:

an average black spot density no greater than 5 mm$^{-2}$, 3 mm$^{-2}$, 1 mm$^{-2}$, 0.5 mm$^{-2}$, or 0.1 mm$^{-2}$;
a black spot distribution such that there are no more than 5, 4, 3, 2, or 1 black spots within any 3 mm$^2$ area;
an integrated absorbance per unit thickness of no more than 0.20 cm$^{-2}$, 0.15 cm$^{-2}$, 0.10 cm$^{-2}$, or 0.05 cm$^{-2}$, when measured with a corrected linear background in a range 2760 cm$^{-1}$ to 3030 cm$^{-1}$;
a thermal conductivity of no less than 1800 Wm$^{-1}$K$^{-1}$, 1900 Wm$^{-1}$K$^{-1}$, 2000 Wm$^{-1}$K$^{-1}$, 2100 Wm$^{-1}$K$^{-1}$, or 2200 Wm$^{-1}$K$^{-1}$; and
a silicon concentration as measured by secondary ion mass spectrometry of no more than $10^{17}$ cm$^{-3}$, $5 \times 10^{16}$ cm$^{-3}$, $10^{16}$ cm$^{-3}$, $5 \times 10^{15}$ cm$^{-3}$, or $10^{15}$ cm$^{-3}$.

7. An optical element according to claim 1, wherein the flattened lens surface structure is configured to focus light at an operating wavelength in the infrared, visible, or ultraviolet region of the electromagnetic spectrum.

8. An optical element according to claim 7, wherein the optical element has a reflectance of no more than 3%, 2%, 1.5%, 1% or 0.5% at the operating wavelength of the optical element.

9. An optical element according to claim 7, wherein the optical element has a transmittance of at least 97%, 98% or 99% at the operating wavelength of the optical element.

10. An optical element according to claim 7, wherein the optical element has a total integrated scatter in a forward hemisphere no more than 2%, 1%, 0.5%, or 0.1% at the operating wavelength of the optical element.

11. An optical element according to claim 1, wherein the flattened lens surface structure is formed in at least one surface of the synthetic diamond material over an area of at least 50 mm$^2$, 100 mm$^2$, 200 mm$^2$, 300 mm$^2$, 500 mm$^2$, 700 mm$^2$, 1000 mm$^2$, 1500 mm$^2$, 2000 mm$^2$, 3000 mm$^2$, 5000 mm$^2$, 7000 mm$^2$, 10000 mm$^2$, 15000 mm$^2$, or 20000 mm$^2$.

12. An optical element according to claim 11, wherein the optical element meets the requirements defined in claim 1 over at least 50%, 60%, 70%, 80%, 90%, or 100% of said area.

13. An optical element according to claim 1, wherein the flattened lens surface structure comprises zone structures filled with a solid material which is selected to enhance diffraction and/or refraction efficiency of the flattened lens surface structure.

14. An optical system comprising:
   an optical element according to claim 1; and
   a light source configured to generate light at a power of at least 20 kW and transmit said light through the optical element at an operating wavelength in the infrared, visible, or ultraviolet region of the electromagnetic spectrum.

15. An optical system according to claim 14, wherein the light source is configured to generate light at a power of at least 25 kW, 30 kW, 35 kW, 40 kW, 45 kW, or 50 kW.

* * * * *